(12) United States Patent
Noh et al.

(10) Patent No.: US 11,244,644 B2
(45) Date of Patent: Feb. 8, 2022

(54) SHIFT REGISTER AND DISPLAY DEVICE USING THE SAME

(71) Applicant: LG Display Co., Ltd., Seoul (KR)

(72) Inventors: Seok Noh, Paju-si (KR); Kyungmin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 196 days.

(21) Appl. No.: 16/599,810

(22) Filed: Oct. 11, 2019

(65) Prior Publication Data
US 2020/0118509 A1    Apr. 16, 2020

(30) Foreign Application Priority Data
Oct. 12, 2018    (KR) .......................... 10-2018-0121868

(51) Int. Cl.
| G09G 3/36 | (2006.01) |
| G11C 19/28 | (2006.01) |
| G09G 3/3266 | (2016.01) |

(52) U.S. Cl.
CPC ......... *G09G 3/3677* (2013.01); *G09G 3/3266* (2013.01); *G11C 19/28* (2013.01); *G09G 2310/0286* (2013.01)

(58) Field of Classification Search
CPC .............. G09G 3/3677; G09G 3/3266; G09G 2310/0286; G09G 3/20; G09G 3/3674; G09G 2300/0408; G09G 2310/0291; G11C 19/28

See application file for complete search history.

(56) References Cited

U.S. PATENT DOCUMENTS

| 2007/0146289 A1* | 6/2007 | Lee ...................... G09G 3/3677 345/100 |
| 2011/0273417 A1* | 11/2011 | Shin ........................ G09G 3/20 345/211 |
| 2013/0100007 A1* | 4/2013 | Yamamoto ............... G09G 3/36 345/100 |
| 2014/0044228 A1* | 2/2014 | Jang ..................... G11C 19/287 377/64 |
| 2015/0077407 A1* | 3/2015 | Kim ..................... G09G 3/3677 345/204 |
| 2017/0004760 A1* | 1/2017 | Jang ....................... G11C 19/28 |
| 2017/0186378 A1* | 6/2017 | Na ....................... G09G 3/3266 |

FOREIGN PATENT DOCUMENTS

| KR | 10-2007-0053209 A | 5/2007 |
| KR | 10-2009-0128346 A | 12/2009 |
| KR | 10-2014-0052454 A | 5/2014 |

* cited by examiner

*Primary Examiner* — Jonathan A Boyd
(74) *Attorney, Agent, or Firm* — Seed IP Law Group LLP

(57) ABSTRACT

The disclosure provides a shift register including a node controller configured to control charging and discharging of a node Q and a node QB, and an output circuit including a first buffer transistor configured to output a first scan signal, a second buffer transistor configured to output a second scan signal and a third buffer transistor configured to output a carry signal in response to electric potentials of the node Q and the node QB. The first buffer transistor and the second buffer transistor have different channel region widths. The output circuit may further include a first dummy buffer transistor having a common gate and common drain connection structure with the first buffer transistor.

10 Claims, 13 Drawing Sheets

Buffer A + C (compensation) ≒ Buffer B

SHIFT REGISTER AND DISPLAY DEVICE USING THE SAME

This application claims the benefit of Korean Patent Application No. 10-2018-0121868, filed on Oct. 12, 2018, which is incorporated herein by reference for all purposes as if fully set forth herein.

BACKGROUND

Technical Field

The disclosure relates to a shift register and a display device using the same.

Description of the Related Art

With the development of information technology, the market for display devices that are connection media between users and information is growing. Accordingly, display devices such as an organic light emitting display (OLED), a quantum dot display (QDD), a liquid crystal display (LCD) and a plasma display panel (PDP) are increasingly used.

Some of the aforementioned display devices, for example, the LCD or the OLED includes a display panel having a plurality of sub-pixels, a driver that outputs driving signals for driving the display panel, and a power supply that generates power to be supplied to the display panel and the driver. The driver includes a scan driver that provides scan signals (or gate signals) to the display panel and a data driver that provides data signals to the display panel.

The aforementioned display device can display images in such a manner that selected sub-pixels transmit light or directly emit light when driving signals, for example, scan signals and data signals are provided to sub-pixels formed on the display panel.

BRIEF SUMMARY

In one embodiment, the disclosure provides a shift register including a node controller configured to control charging and discharging of a first node and a second node, and an output circuit including a first buffer transistor configured to output a first scan signal, a second buffer transistor configured to output a second scan signal and a third buffer transistor configured to output a carry signal in response to electric potentials of the first node and the second node. The first buffer transistor and the second buffer transistor have different channel region widths. The output circuit may further include a first dummy buffer transistor having a common gate and common drain connection structure with the first buffer transistor.

In one embodiment, the disclosure provides a shift register including a node controller configured to control charging and discharging of a first node and a second node, and an output circuit including a first pull-up transistor configured to output a first scan signal, a second pull-up transistor configured to output a second scan signal and a third pull-up transistor configured to output a carry signal in response to electric potentials of the first node and the second node. The first pull-up transistor and the second pull-up transistor have different channel region widths. The output circuit further includes a first dummy buffer transistor having a common gate and a common drain connection structure with the first pull-up transistor.

In one embodiment, the disclosure provides a display device including: a display panel configured to display images; a data driver configured to provide data voltages to the display panel; and a scan driver including a level shifter configured to output a clock signal for supplying scan signals to the display panel, and a shift register configured to output the scan signals on the basis of the clock signal. The shift register includes a node controller configured to control charging and discharging of a first node and a second node, and an output circuit including a first pull-up transistor configured to output a first scan signal, a second pull-up transistor configured to output a second scan signal and a third pull-up transistor configured to output a carry signal in response to electric potentials of the first node and the second node. The first pull-up transistor and the second pull-up transistor have different channel region widths. The output circuit further includes a first dummy buffer transistor having a common gate and common drain connection structure with the first pull-up transistor.

BRIEF DESCRIPTION OF THE SEVERAL VIEWS OF THE DRAWINGS

The accompany drawings, which are included to provide a further understanding of the various embodiments of the present disclosure and are incorporated on and constitute a part of this specification, illustrate embodiments of the present disclosure and together with the description serve to explain the principles of the present disclosure.

DETAILED DESCRIPTION

Figure 1:
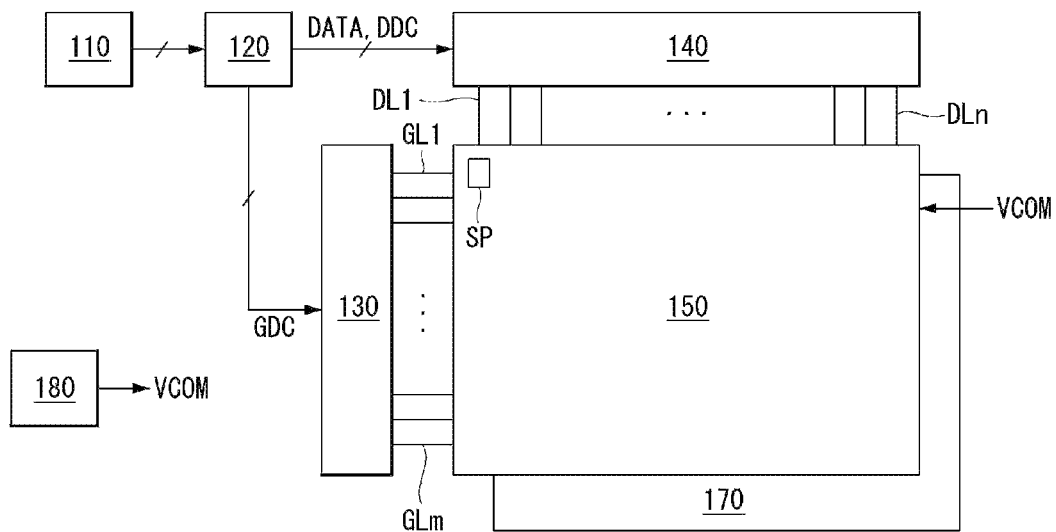
FIG. 1 is a block diagram schematically showing an LCD device.

Reference will now be made in detail embodiments of the disclosure examples of which are illustrated in the accompanying drawings.

Hereinafter, specific embodiments of the disclosure will be described with reference to the attached drawings.

With the development of information technology, the market for display devices that are connection media between users and information is growing. Accordingly, display devices such as a quantum dot display (QDD), a liquid crystal display (LCD), an organic light emitting display (OLED) and a plasma display panel (PDP) are increasingly used.

Some of the aforementioned display devices, for example, the LCD or the OLED includes a display panel having a plurality of sub-pixels, a driver which outputs driving signals for driving the display panel, and a power supply which generates power to be supplied to the display panel and the driver. The driver includes a scan driver which provides scan signals (or gate signals) to the display panel and a data driver which provides data signals to the display panel.

The aforementioned display device can display images in such a manner that selected sub-pixels transmit light or directly emit light when driving signals, for example, scan signals and data signals are provided to sub-pixels formed on the display panel.

Hereinafter, description relating to the disclosure will be continued using an LCD device and an OLED device as examples. The disclosure described below can also be applied to display devices based on an inorganic light-emitting diode as well as an organic light-emitting diode.

Furthermore, although a shift register of a scan driver which will be described below is realized using an n-type thin film transistor as an example, the shift register may be realized using a p-type thin film transistor. A thin film transistor is a three-electrode element including a gate, a source and a drain. The source is an electrode that supplies carriers to the transistor. Carriers flow from the source in the thin film transistor. The drain is an electrode from which carriers flow to the outside of the thin film transistor. That is, carriers flow from the source to the drain in the thin film transistor.

In the case of an n-type thin film transistor, a source voltage is lower than a drain voltage such that electrons can flow from the source to the drain because the electrons are carriers. Since electrons flow from the source to the drain in the n-type thin film transistor, current flows from the drain to the source. On the other hand, in the case of a p-type thin film transistor, a source voltage is higher than a drain voltage such that holes can flow from the source to the drain because the holes are carriers. Since holes flow from the source to the drain in the p-type thin film transistor, current flows from the source to the drain. However, the source and the drain of the thin film transistor may be switched according to an applied voltage. In view of this, one of the source and drain will be described as a first electrode and the other will be described as a second electrode in the following description.

Figure 2:
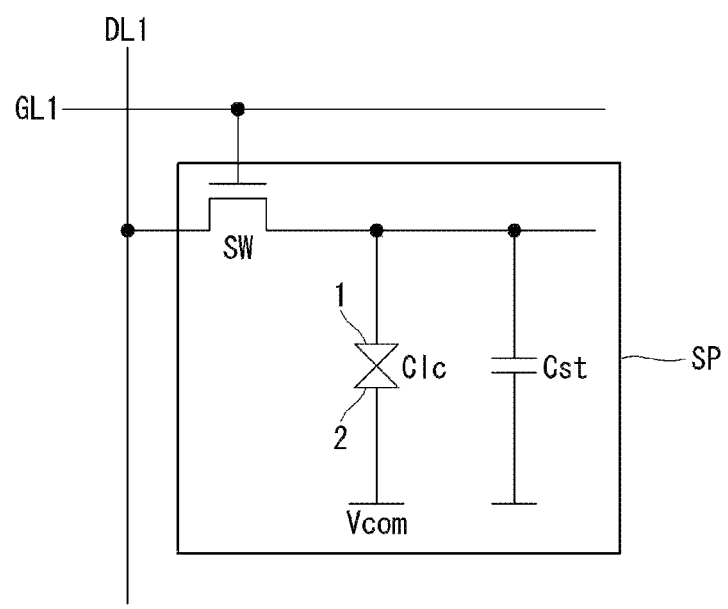
FIG. 2 is a circuit diagram schematically showing a sub-pixel shown in FIG. 1.

FIG. 1 is a block diagram schematically showing an LCD device and FIG. 2 is a circuit diagram schematically showing a sub-pixel shown in FIG. 1.

As shown in FIGS. 1 and 2, the LCD device includes an image provider 110, a timing controller 120, a scan driver 130, a data driver 140, a liquid crystal panel 150, a back light unit 170 and a power supply 180.

The image provider 110 outputs various driving signals along with an image data signal supplied from the outside or an image data signal stored in an internal memory. The image provider 110 provides the data signal and the various driving signals to the timing controller 120.

The timing controller 120 outputs a gate timing control signal GDC for controlling an operation timing of the scan driver 130, a data timing control signal DDC for controlling an operation timing of the data driver 140, and various synchronization signals (a vertical synchronization signal Vsync and a horizontal synchronization signal Hsync). The timing controller 120 provides the data signal (or a data voltage) DATA supplied from the image provider 110 along with the data timing control signal DDC to the data driver 140. Although the timing controller 120 may be configured in the form of an integrated circuit (IC) and mounted on a printed circuit board, the disclosure is not limited thereto.

The scan driver 130 outputs a scan signal (or a gate signal) in response to the gate timing control signal GDC supplied from the timing controller 120. The scan driver 130 provides the scan signal to sub-pixels included in the liquid crystal panel 150 through gate lines GL1 to GLm. The scan driver 130 may be configured in the form of an IC or may be directly formed on the liquid crystal panel 150 in a gate-in-panel structure, but the disclosure is not limited thereto.

The data driver 140 samples and latches the data signal DATA in response to the data timing control signal DDC supplied from the timing controller 120, converts the digital data signal into an analog data signal on the basis of a gamma reference voltage and outputs the analog data signal. The data driver 140 provides data voltages to the sub-pixels included in the liquid crystal panel 150 through data lines DL1 to DLn. The data driver 140 may be configured in the form of an IC and mounted on the display panel 150 or mounted on a printed circuit board, but the disclosure is not limited thereto.

The power supply 180 generates a common voltage VCOM on the basis of an external input voltage supplied from the outside and outputs the common voltage VCOM. The power supply 180 can generate and output voltages (e.g., a scan high voltage and a scan low voltage) sufficient to drive the scan driver 130 and voltages (e.g., a drain voltage and a half drain voltage) sufficient to drive the data driver 140 as well as the common voltage VCOM.

The liquid crystal panel 150 displays an image in response to scan signals supplied from the scan driver 130, data voltages supplied from the data driver 140 and the common voltage VCOM supplied from the power supply 180. The sub-pixels of the liquid crystal panel 150 control light provided through the back light unit 170.

For example, one sub-pixel SP includes a switching transistor SW, a storage capacitor Cst and a liquid crystal layer Clc. The gate electrode of the switching transistor SW is connected to a scan line GL1 and the source electrode thereof is connected to a data line DL1. One terminal of the storage capacitor Cst is connected to the drain electrode of the switching transistor SW and the other terminal thereof is connected to a common voltage line Vcom. The liquid crystal layer Clc is formed between a pixel electrode 1 connected to the drain electrode of the switching transistor SW and a common electrode 2 connected to the common voltage line Vcom.

The liquid crystal panel 150 is realized in a twisted nematic (TN) mode, a vertical alignment (VA) mode, an in-plane switching (IPS) mode, a fringe field switching (FFS) mode or an electrically controlled birefringence (ECB) mode according to structures of the pixel electrode 1 and the common electrode 2.

The back light unit 170 provides light to the liquid crystal panel 150 using a light source that emits light. Although the back light unit 170 may include a light-emitting diode (LED) driver which drives LEDs, an LED substrate on which LEDs are mounted, a light guide plate which converts light emitted from LEDs into surface light, a reflector which reflects light under the light guide plate, and optical sheets which condense and spread light emitted from the light guide plate, the disclosure is not limited thereto.

Figure 3:
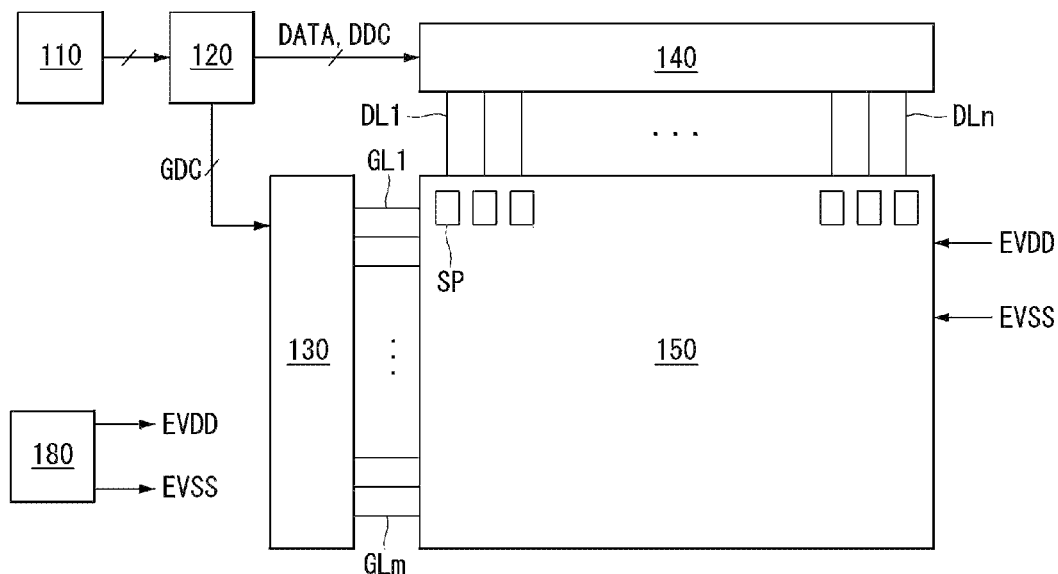
FIG. 3 is a block diagram schematically showing an OLED device.
Figure 4:
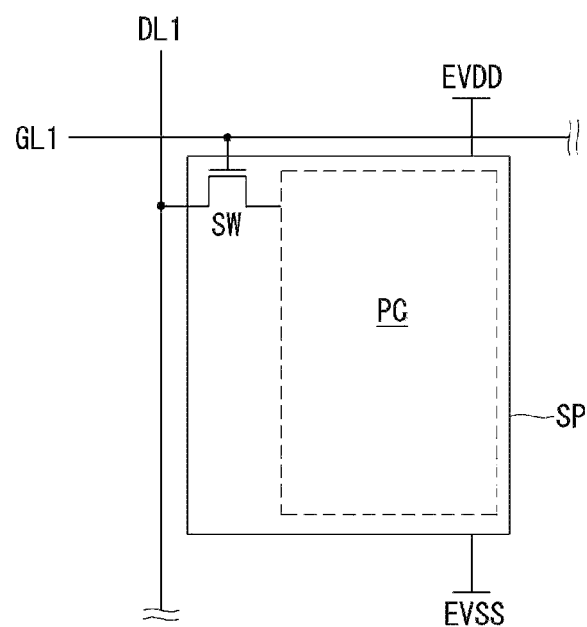
FIG. 4 is a diagram schematically showing a configuration of a sub-pixel shown in FIG. 3.

FIG. 3 is a block diagram schematically showing an OLED device and FIG. 4 is a diagram schematically showing a configuration of a sub-pixel shown in FIG. 3.

As shown in FIGS. 3 and 4, the OLED device includes an image provider 110, a timing controller 120, a scan driver 130, a data driver 140, a display panel 150 and a power supply 170.

Basic configurations and operations of the image provider 110, the timing controller 120, the scan driver 130 and the data driver 140 included in the OLED device are similar to those of the LCD device shown in FIG. 1 and thus detailed description thereof is omitted. Instead, the power supply 180 and the display panel 150 distinguished from those of the LCD will be described in more detail.

The power supply 180 generates a first power voltage EVDD that is a high voltage and a second power voltage EVSS that is a low voltage on the basis of an external input voltage supplied from the outside and outputs the first power voltage EVDD and the second power voltage EVSS. The power supply 180 can generate and output voltages (e.g., a scan high voltage and a scan low voltage) sufficient to drive the scan driver 130 and voltages (e.g., a drain voltage and a half drain voltage) sufficient to drive the data driver 140 as well as the first and second power voltages EVDD and EVSS.

The display panel 150 displays an image in response to scan signals and data voltages output from drivers including the scan driver 130 and the data driver 140 and the first and second power voltages EVDD and EVSS output from the power supply 180. Sub-pixels of the display panel 150 directly emit light.

For example, one sub-pixel SP includes a switching transistor SW and a pixel circuit PC including a driving transistor, a storage capacitor and an OLED. The sub-pixel SP used in the OLED device directly emits light and thus has a complicated circuit configuration compared to LCDs. Furthermore, not only an OLED emitting light but also a compensation circuit for compensating for deterioration of a driving transistor that supplies driving current to the OLED are configured in complicated and various manners. Accordingly, the pixel circuit PC included in the sub-pixel SP is shown in the form of a block.

Figure 5A:
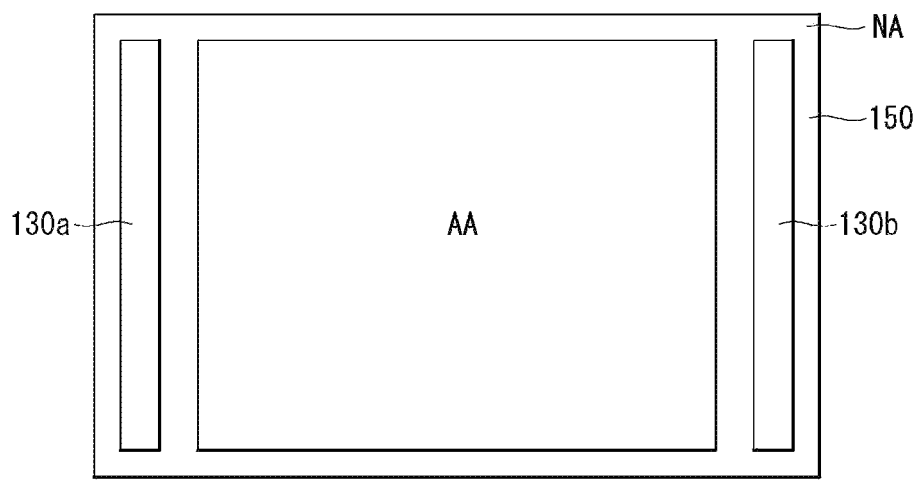
FIGS. 5A and 5B are diagrams showing examples of arrangement of scan drivers in a gate-in-panel structure.
Figure 5B:
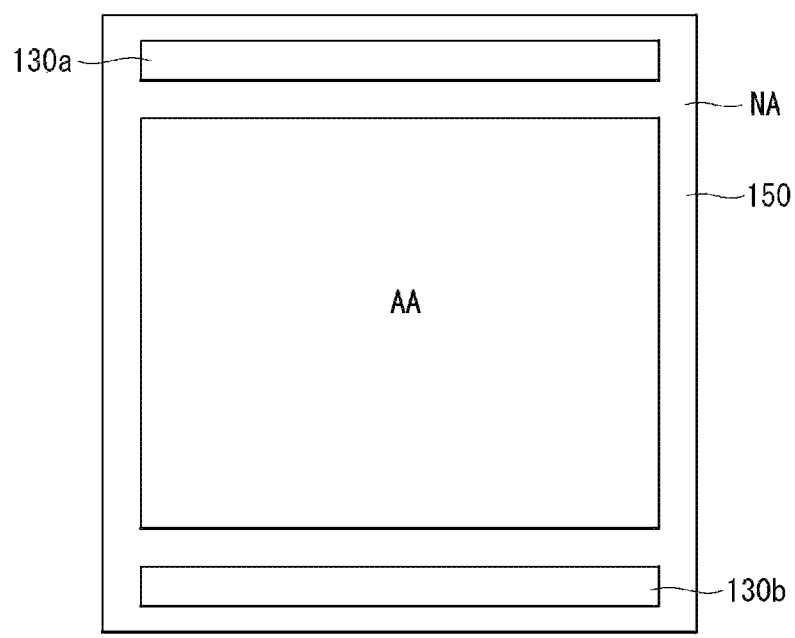
Figure 6:
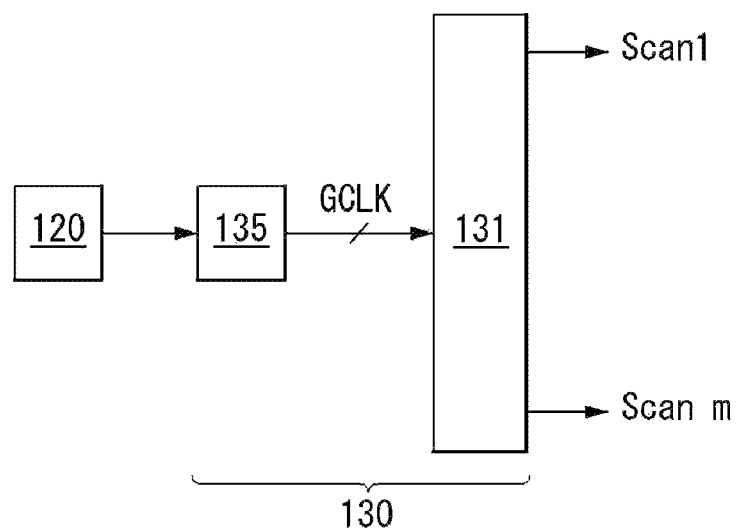
FIG. 6 is a diagram illustrating a first configuration of a device related to the scan drivers in a gate-in-panel structure.
Figure 7:
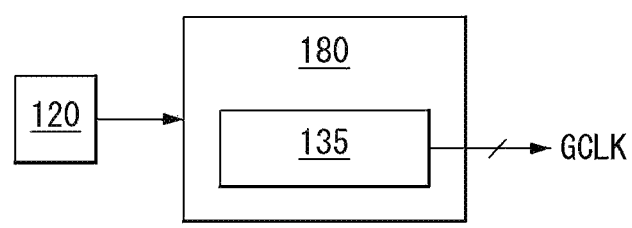
FIG. 7 is a diagram illustrating a second configuration of a device related to the scan drivers in a gate-in-panel structure.

FIGS. 5A and 5B are diagrams showing examples of arrangement of scan drivers in a gate-in-panel structure, FIG. 6 is a diagram illustrating a first configuration of a device related to the scan drivers in a gate-in-panel structure, and FIG. 7 is a diagram illustrating a second configuration of a device related to the scan drivers in a gate-in-panel structure.

As shown in FIGS. 5A and 5B, scan drivers 130a and 130b in a gate-in-panel structure are disposed in non-display areas of the display panel 150. The scan drivers 130a and 130b can be disposed in left and right non-display areas NA of the display panel 150, as shown in FIG. 5A. Further, the scan drivers 150a and 150b may be disposed in upper and lower non-display areas NA of the display panel 150, as shown in FIG. 5B.

Although an example in which a pair of scan drivers 130a and 130b are disposed in non-display areas NA located on the left and right or the upper and lower sides of a display area AA has been illustrated and described, the disclosure is not limited thereto and a single scan driver may be disposed in a non-display area NA located on the left, right, upper or lower side of the display area AA.

As shown in FIG. 6, the scan driver 130 in a gate-in-panel structure may include a shift register 131 and a level shifter 135. The level shifter 135 generates a plurality of clock signals GCLK on the basis of signals output from the timing controller 120 and outputs the clock signals GCLK. The plurality of clock signals GCLK is generated to have N different phases (N is an integer equal to or greater than 2) such as 2 phases, 4 phases or 8 phases.

The shift register 131 operates on the basis of the plurality of clock signals GCLK output from the level shifter 135 and outputs signals Scan 1 to Scan m that can turn transistors formed on the display panel on or off. The shift register 131 includes a plurality of stages. The plurality of stages has a cascaded structure and receives an output signal of at least one preceding or following stage as an input signal. One stage outputs at least one signal. For example, Scan 1 corresponds to a signal output from a first stage and Scan m corresponds to a signal output from an m-th stage.

The level shifter 135 is configured in the form of an IC, whereas the shift register 131 is configured in the form of a thin film in a gate-in-panel structure. That is, a part of the scan driver 130 which is formed on the display panel is the shift register 131 (130a and 130b in FIGS. 5A and 5B corresponds to 131).

Distinguished from the shift register 131, the level shifter 135 is configured in the form of an IC. Accordingly, the level shifter 135 can be configured in the form of a separate IC as shown in FIG. 6 and may be included in the power supply 180, as shown in FIG. 7.

Figure 8:
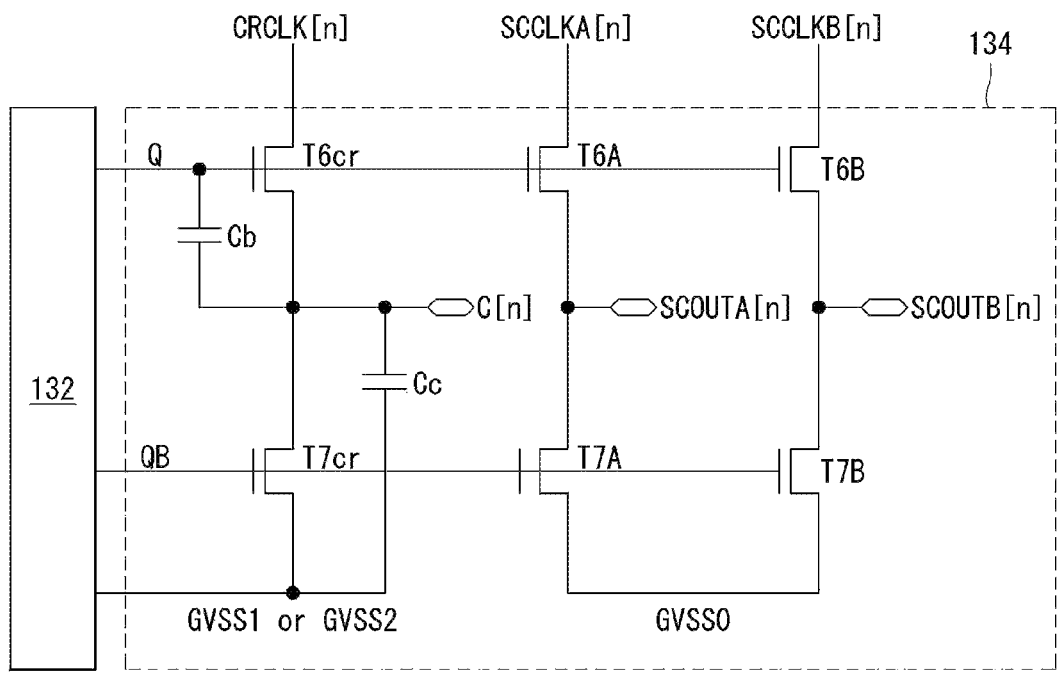
FIG. 8 is a diagram showing a part of a shift register according to an experimental example of the disclosure.
Figure 9:
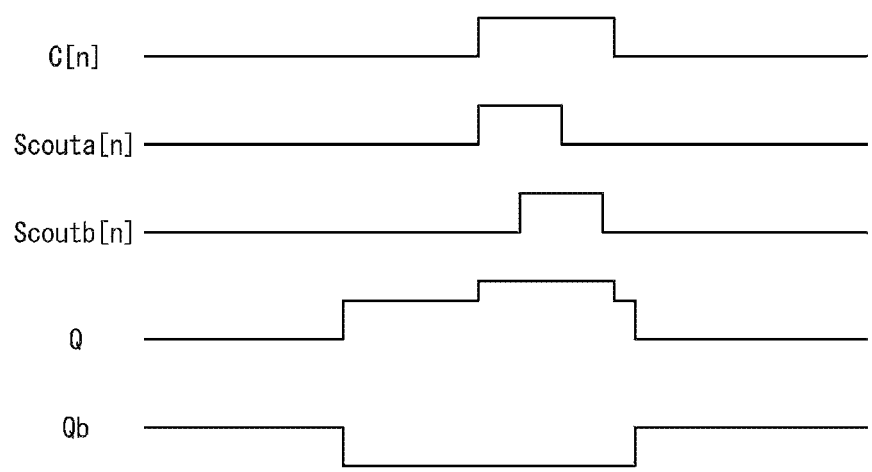
FIG. 9 is a diagram showing node voltages and output waveforms of the shift register shown in FIG. 8.
Figure 10:
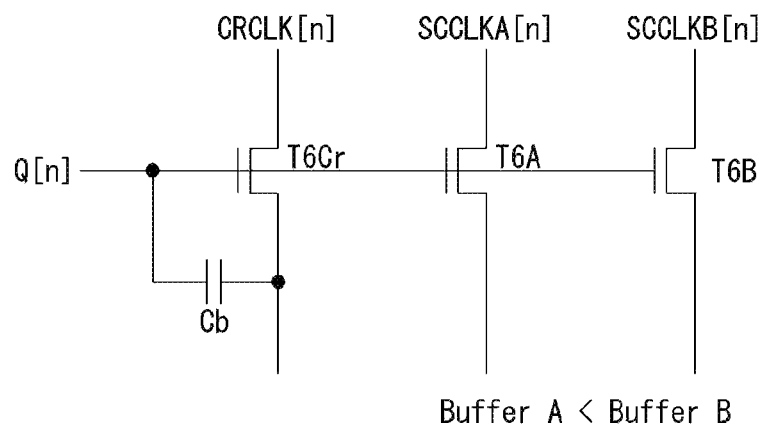
FIGS. 10 and 11 are diagrams for description related to output buffers of the shift register shown in FIG. 8.
Figure 11:
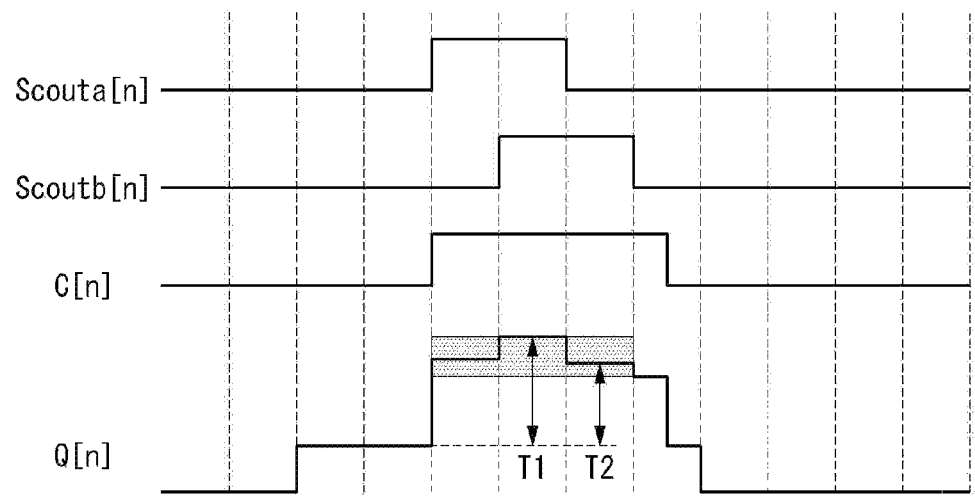

FIG. 8 is a diagram showing a part of a shift register according to an experimental example of the disclosure, FIG. 9 is a diagram showing node voltages and output waveforms of the shift register shown in FIG. 8, and FIGS. 10 and 11 are diagrams for description related to output buffers of the shift register shown in FIG. 8.

As shown in FIGS. 8 and 9, the shift register 131 according to the experimental example includes a node controller 132 and an output circuit 134. The node controller 132 serves to control charging/discharging of a Q node Q and a QB node QB of the output circuit 134. The output circuit 134 serves to output a carry signal C[n] along with scan signals Scouta[n] and Scoutb[n] in response to electric potentials of the Q node Q and the QB node QB.

The output circuit 134 includes first buffer transistors T6A and T7A that output the first scan signal Scouta[a], second buffer transistors T6B and T7B that output the second scan signal Scoutb[n], and third buffer transistors T6cr and T7cr that output the carry signal C[n].

The first buffer transistors T6A and T7A output the first scan signal Scouta[n] on the basis of a first clock signal applied through a first clock signal line SCCLKA[n] and a first low voltage applied through a first low voltage line GVSS0. The first buffer transistors T6A and T7A are turned on/off in response to electric potentials charged/discharged to/from the Q node Q and the QB node QB. The first buffer transistors T6A and T7A include a first pull-up transistor T6A turned on in response to the electric potential of the Q node Q and a first pull-down transistor T7A turned on in response to the electric potential of the QB node QB.

The second buffer transistors T6B and T7B output the second scan signal Scoutb[n] on the basis of a second clock signal applied through a second clock signal line SCCLKB[n] and the first low voltage applied through the first low voltage line GVSS0. The second buffer transistors T6B and T7B are turned on/off in response to electric potentials charged/discharged to/from the Q node Q and the QB node QB. The second buffer transistors T6B and T7B include a second pull-up transistor T6B turned on in response to the electric potential of the Q node Q and a second pull-down transistor T7B turned on in response to the electric potential of the QB node QB.

The third buffer transistors T6cr and T7cr output the carry signal C[n] on the basis of a third clock signal applied through a third clock signal line SRCLK[n] and a second or third low voltage applied through a second or third low voltage line GVSS1 or GVSS2. The third buffer transistors T6cr and T7cr are turned on/off in response to electric potentials charged/discharged to/from the Q node Q and the QB node QB. The third buffer transistors T6cr and T7cr include a third pull-up transistor T6cr turned on in response to the electric potential of the Q node Q and a third pull-down transistor T7cr turned on in response to the electric potential of the QB node QB.

Meanwhile, an example in which capacitors Cb and Cc for stably maintaining output of the carry signal C[n] are provided to the output terminals of the third buffer transistors T6cr and T7cr is illustrated. "Cb" serves to perform carry boosting (bootstrapping) for stable output of the carry signal and "Cc" serves to maintain the output for stable output of the carry signal. However, the capacitors Cb and Cc may also be included in the first buffer transistors T6A and T7A or the second buffer transistors T6B and T7B, and the disclosure is not limited to the configuration shown in the figure.

As shown in FIGS. 8, 10 and 11, the first to third pull-up transistors T6A, T6B and T6cr of the shift register 131 according to the experimental example output the carry signal C[n] along with the logic high scan signals Scouta[n] and Scoutb[n] on the basis of the clock signals.

The output duration of the carry signal C[n] is longer than those of the first second scan signal Scouta[n] and the second scan signal Scoutb[n]. In this case, if the boost capacitor Cb for carry boosting is provided between the gate electrode and the source electrode of the third pull-up transistor T6cr, the carry signal C[n] can be stably output.

The first scan signal Scouta[n] and the second scan signal Scoutb[n] are output overlapping for the output duration of the carry signal C[n]. The first scan signal Scouta[n] is output before the second scan signal Scoutb[n], and output is performed in a state in which the charged electric potential of the Q node Q is sufficient. In such a case, even if channel regions of output buffers are designed to have different widths under the condition of "first pull-up transistor T6A<second pull-up transistor T6B", a buffer driving voltage difference can be reduced, an output deviation can be decreased and output signal falling time can be optimized.

Figure 12:
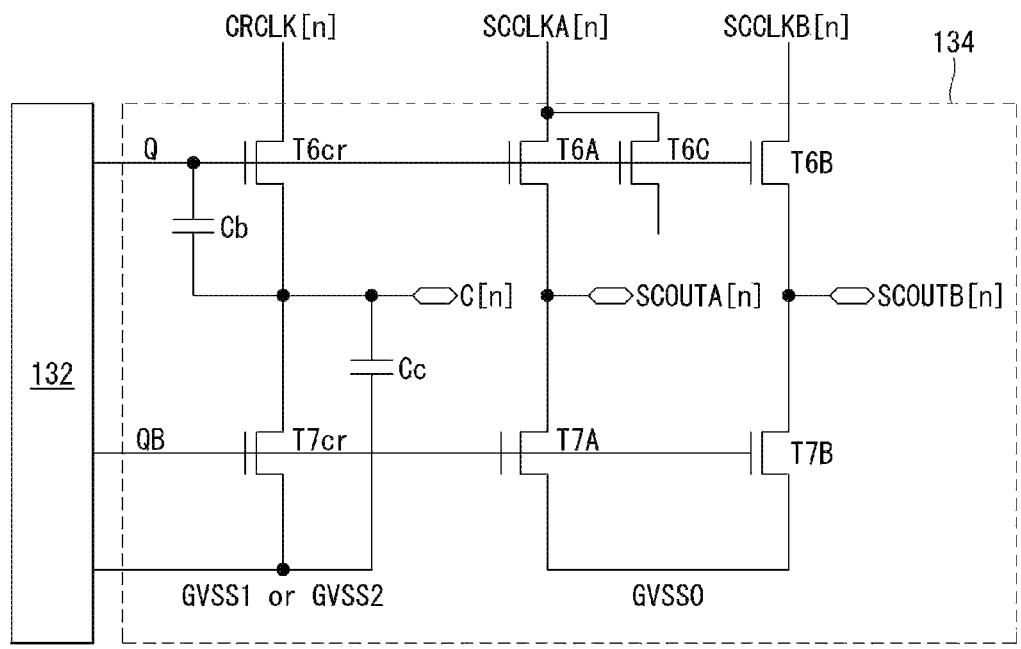
FIG. 12 is a diagram showing a part of a shift register according to a first embodiment of the disclosure.
Figure 13:
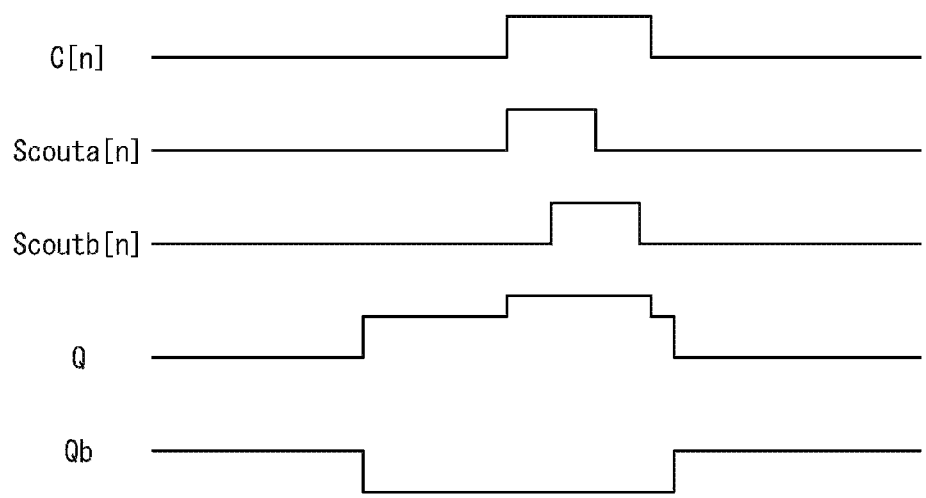
FIG. 13 is a diagram showing node voltages and output waveforms of the shift register shown in FIG. 12.
Figure 14:
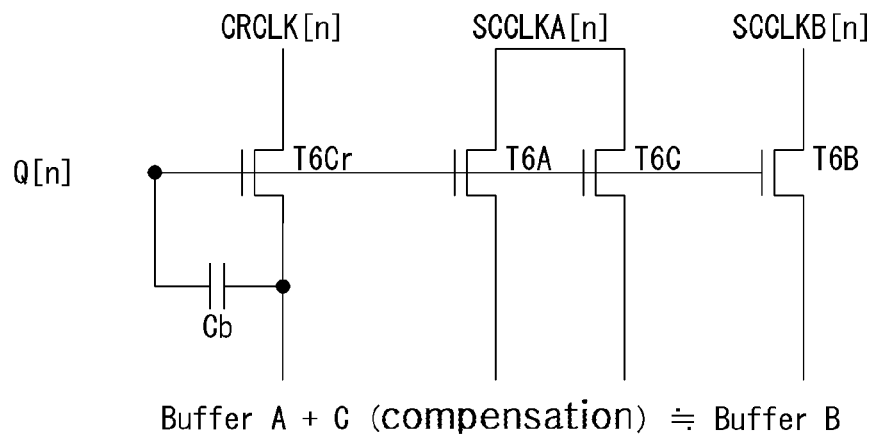
FIGS. 14 and 15 are diagrams for description related to output buffers of the shift register shown in FIG. 12.
Figure 15:
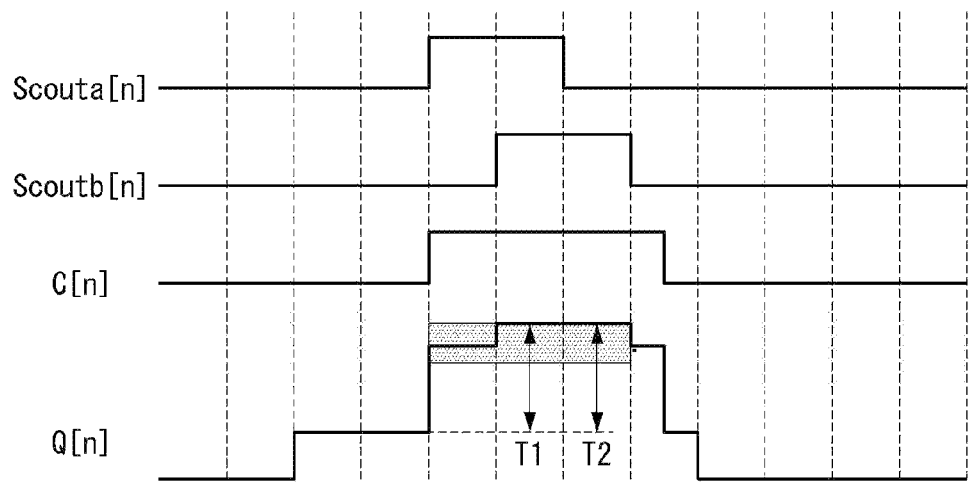
Figure 16:
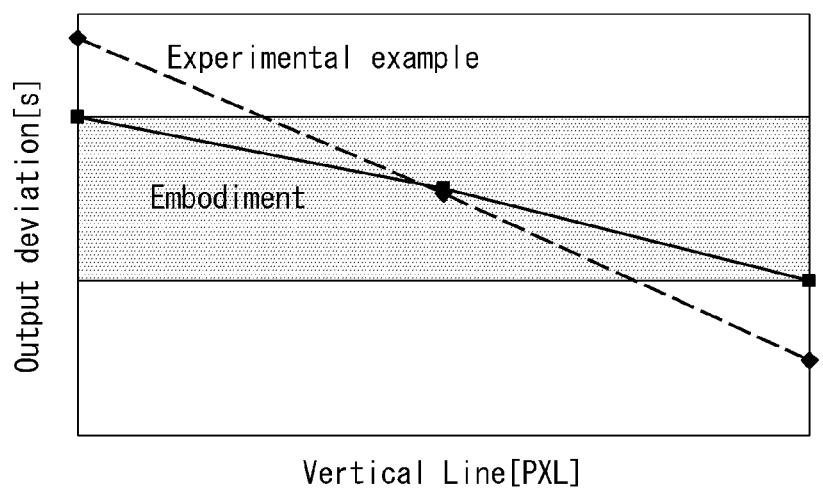
FIG. 16 is a diagram for comparatively describing differences between the experimental example and the first embodiment.

FIG. 12 is a diagram showing a part of a shift register according to a first embodiment of the disclosure, FIG. 13 is a diagram showing node voltages and output waveforms of the shift register shown in FIG. 12, FIGS. 14 and 15 are diagrams for description related to output buffers of the shift register shown in FIG. 12, and FIG. 16 is a diagram for comparatively describing differences between the experimental example and the first embodiment.

As shown in FIGS. 12 and 13, the shift register 131 according to the first embodiment of the disclosure includes a node controller 132 and an output circuit 134. The node controller 132 serves to control charging/discharging of a Q node Q and a QB node QB of the output circuit 134. The output circuit 134 serves to output a carry signal C[n] along with scan signals Scouta[n] and Scoutb[n] in response to electric potentials of the Q node Q and the QB node QB.

The output circuit 134 includes first buffer transistors T6A, T7A and T6C that output the first scan signal Scouta[a], second buffer transistors T6B and T7B that output the second scan signal Scoutb[n], and third buffer transistors T6cr and T7cr that output the carry signal C[n].

The first buffer transistors T6A, T7A and T6C output the first scan signal Scouta[n] on the basis of a first clock signal applied through a first clock signal line SCCLKA[n] and a first low voltage applied through a first low voltage line GVSS0. The first buffer transistors T6A, T7A and T6C are turned on/off in response to electric potentials charged/discharged to/from the Q node Q and the QB node QB. The first buffer transistors T6A, T7A and T6C include a first pull-up transistor T6A turned on in response to the electric potential of the Q node Q, a first dummy buffer transistor T6C, and a first pull-down transistor T7A turned on in response to the electric potential of the QB node QB.

The second buffer transistors T6B and T7B output the second scan signal Scoutb[n] on the basis of a second clock signal applied through a second clock signal line SCCLKB[n] and the first low voltage applied through the first low voltage line GVSS0. The second buffer transistors T6B and T7B are turned on/off in response to electric potentials charged/discharged to/from the Q node Q and the QB node QB. The second buffer transistors T6B and T7B include a second pull-up transistor T6B turned on in response to the electric potential of the Q node Q and a second pull-down transistor T7B turned on in response to the electric potential of the QB node QB.

The third buffer transistors T6cr and T7cr output the carry signal C[n] on the basis of a third clock signal applied through a third clock signal line SRCLK[n] and a second or third low voltage applied through a second or third low voltage line GVSS1 or GVSS2. The third buffer transistors T6cr and T7cr are turned on/off in response to electric potentials charged/discharged to/from the Q node Q and the QB node QB. The third buffer transistors T6cr and T7cr include a third pull-up transistor T6cr turned on in response to the electric potential of the Q node Q and a third pull-down transistor T7cr turned on in response to the electric potential of the QB node QB.

Meanwhile, an example in which capacitors Cb and Cc for stably maintaining output of the carry signal C[n] are provided to the output terminals of the third buffer transistors T6cr and T7cr is illustrated. "Cb" serves to perform carry boosting (bootstrapping) for stable output of the carry signal and "Cc" serves to maintain the output for stable output of the carry signal. However, the capacitors Cb and Cc may also be included in the first buffer transistors T6A and T7A or the second buffer transistors T6B and T7B, and the disclosure is not limited to the configuration shown in the figure.

As shown in FIGS. 13, 14 and 15, the first to third pull-up transistors T6A, T6B and T6cr of the shift register 131 according to the embodiment of the disclosure output the carry signal C[n] along with the logic high scan signals Scouta[n] and Scoutb[n] on the basis of the clock signals.

The output duration of the carry signal C[n] is longer than those of the first second scan signal Scouta[n] and the second scan signal Scoutb[n]. In this case, if the boost capacitor Cb for carry boosting is provided between the gate electrode and the source electrode of the third pull-up transistor T6cr, the carry signal C[n] can be stably output.

The first scan signal Scouta[n] and the second scan signal Scoutb[n] are output overlapping for the output duration of the carry signal C[n]. The first scan signal Scouta[n] is output before the second scan signal Scoutb[n], and output is performed in a state in which the charged electric potential of the Q node Q is sufficient. In such a case, even if channel regions of output buffers are designed to have different widths under the condition of "first pull-up transistor T6A<second pull-up transistor T6B", a buffer driving voltage difference can be reduced, an output deviation can be decreased and output signal falling time can be optimized.

The shift register 131 according to the first embodiment of the disclosure includes the first dummy buffer transistor T6C that is turned on in response to the Q node Q and has a first electrode commonly connected to the first clock signal line SCCLKA[n] like the first pull-up transistor T6A.

The first dummy buffer transistor T6C serves to eliminate a parasitic capacitance (or TFT Cap) deviation between the first pull-up transistor T6A and the second pull-up transistor T6B under the condition of "first pull-up transistor T6A<second pull-up transistor T6B". That is, the first dummy buffer transistor T6C serves to adjust parasitic capacitances existing in the two output buffers to be similar/identical and thus may be defined as a first compensation transistor.

When the width of the channel region of the first pull-up transistor T6A is defined as "Buffer A", the width of the channel region of the second pull-up transistor T6B is defined as "Buffer B" and the width of the channel region of the first dummy buffer transistor T6C is defined as "Buffer C", a relationship among the widths of the channel regions can be represented as "Buffer A+C (compensation) Buffer B". Since parasitic capacitances existing in the transistors constituting the output buffers vary according to the widths of the channel regions of the transistors, "Buffer A+C (compensation)≈Buffer B" may be defined as a relationship among parasitic capacitances of the corresponding transistors and then re-defined as "A+C≈B". Here, "≈" means "approximately the same", "almost the same" or "similar" and may be represented as "≃".

Therefore, it is desirable to form the first dummy buffer transistor T6C such that it forms a predetermined compensation capacitor in order to execute a function as a compensation transistor as described above. In addition, although the first dummy buffer transistor T6C can have the same channel region width in all stages, the first dummy buffer transistor T6C may be formed to have different channel region widths for stage groups each having K (K is an integer equal to or greater than 2) stages for fine compensation of output deviations. However, the width of the channel region of the first dummy buffer transistor T6C is less than and does not exceed the width of the channel region of the first pull-up transistor T6A or the second pull-up transistor T6B.

Referring to FIG. 11, a bootstrapped voltage is reflected in the charged electric potential of the Q node Q[n] but the electric potential decreases according to falling of the first clock signal in a period T2 following a period T1 in the experimental example. On the other hand, referring to FIG. 15, a bootstrapped voltage is reflected in the charged electric potential of the node Q[n] and the electric potential does not decrease according to falling of the first clock signal and is maintained even in the periods T1 and T2 in the first embodiment.

As can be ascertained through comparison between the experimental example and the first embodiment illustrated in FIG. 16, an output deviation is higher in the experimental example than in the first embodiment even if a design for eliminating an output deviation of the scan driver in the middle of the display panel (middle point on the basis of pixels in the vertical lines) is employed. On the other hand, the output deviation is lower in the first embodiment than in the experimental example even if a design for eliminating an output deviation of the scan driver in the middle of the display panel (middle point on the basis of pixels in the vertical lines) is employed.

As can be ascertained through comparison of charging waveforms and comparison of output deviations between the experimental example and the first embodiment, the first embodiment can improve a falling time deviation in output signals by position which can be caused by different designs of output buffers. In addition, the first embodiment can compensate for a parasitic capacitance deviation between clock signal lines and thus can solve a node charging problem which can be caused by a parasitic capacitance deviation between output buffers. Furthermore, the first embodiment can minimize the influence of a load between clock signal lines using the compensation function of the dummy transistor. Moreover, compensation design can be performed within a range in which a bezel area is not increased because compensation is performed in the output buffer stage in the first embodiment.

Hereinafter, circuit configurations of shift registers and dummy transistor connection structures applicable thereto according to second and third embodiments will be described.

Figure 17:
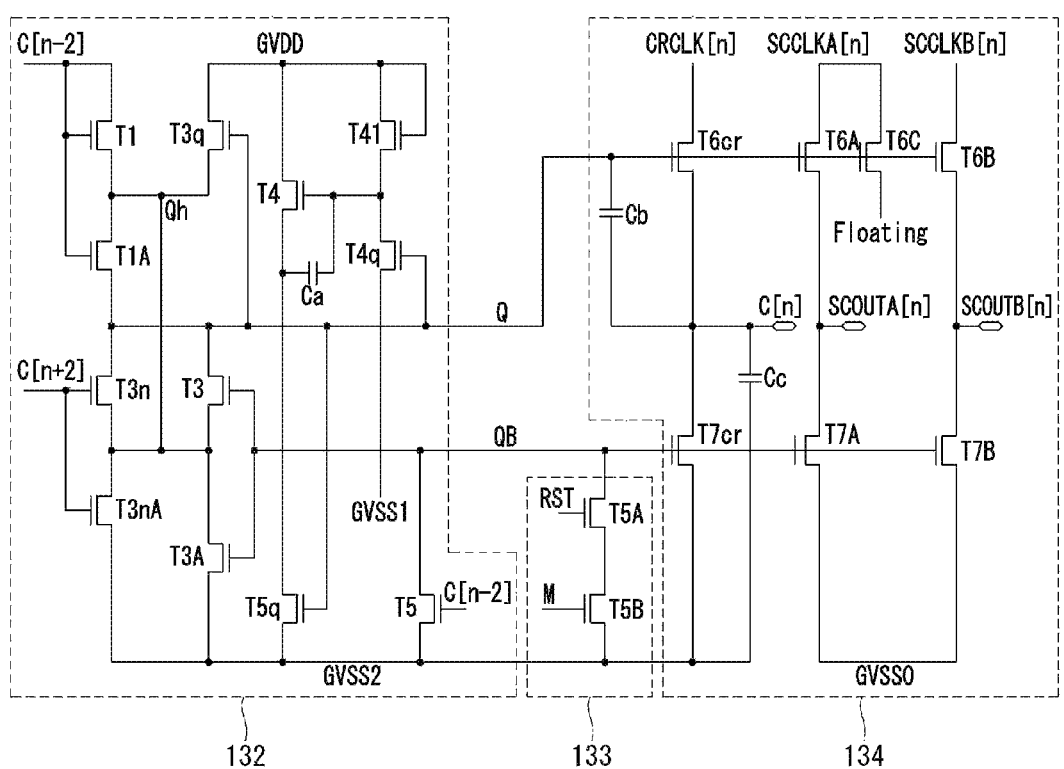
FIG. 17 is a diagram showing a shift register according to a second embodiment of the disclosure.
Figure 18:
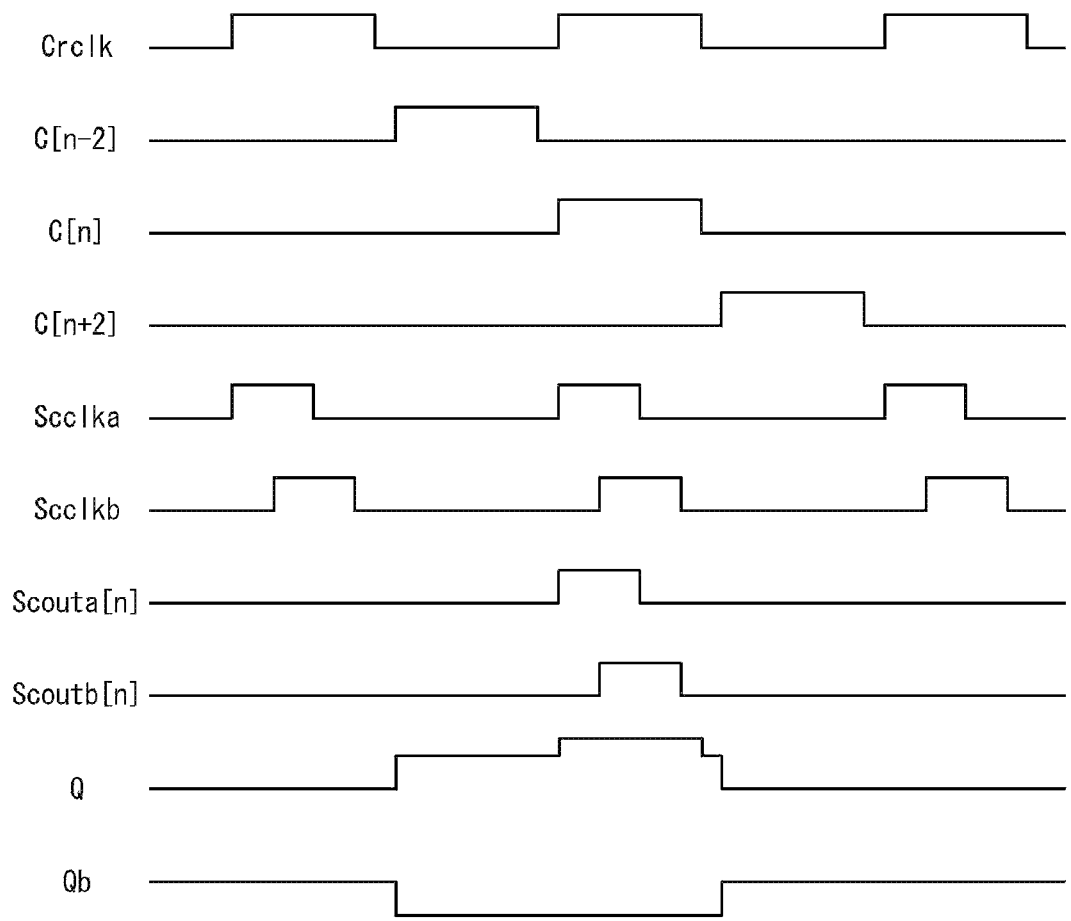
FIG. 18 is a diagram showing node voltages and output waveforms of the shift register shown in FIG. 17.
Figure 19:
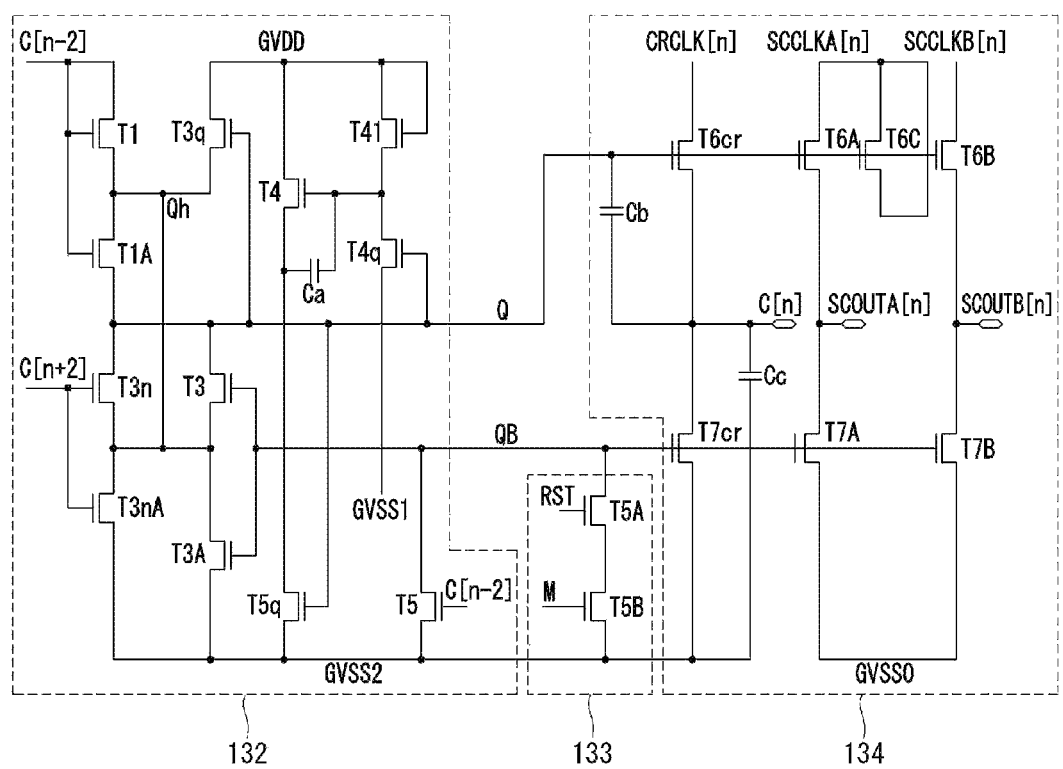
FIG. 19 is a diagram showing a shift register according to a third embodiment of the disclosure.
Figure 20:
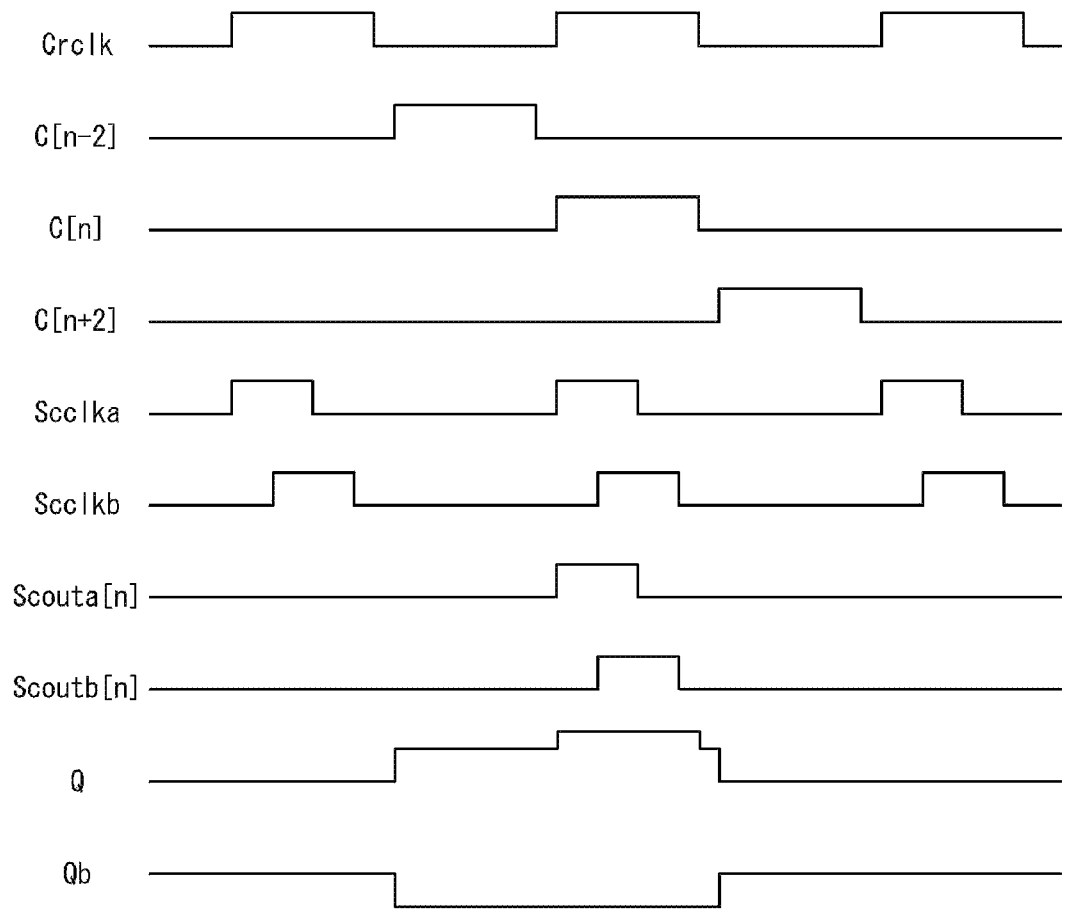
FIG. 20 is a diagram showing node voltages and output waveforms of the shift register shown in FIG. 19.

FIG. 17 is a diagram showing a shift register according to a second embodiment of the disclosure, FIG. 18 is a diagram showing node voltages and output waveforms of the shift register shown in FIG. 17, FIG. 19 is a diagram showing a shift register according to a third embodiment of the disclosure, and FIG. 20 is a diagram showing node voltages and output waveforms of the shift register shown in FIG. 19.

As shown in FIGS. 17 and 18, the shift register 131 according to the second embodiment of the disclosure includes a node controller 132, a reset circuit 133 and an output circuit 134. The shift register 131 operates on the basis of a first clock signal Scclka, a second clock signal Scclkb, a third clock signal Crclk, a first high voltage, first to third high voltages, an (N−2)-th carry signal C[n−2], an (N+2)-th carry signal C[n+2].

The first clock signal Scclka and the second clock signal Scclkb are applied in such a manner that logic high periods thereof partially overlap. The third clock signal Crclk is applied in such a manner that it overlaps both the logic high periods of the first and second clock signals Scclka and Scclkb. Carry signals are applied in the form of pulses in which logic high periods sequentially occur without overlapping because two preceding and following stages are used.

The node controller 132 serves to control charging and discharging of the Q node Q and the QB node QB of the output circuit 134. The reset circuit 133 serves to reset the QB node QB. The output circuit 134 serves to output a carry signal C[n] along with scan signals Scouta[n] and Scoutb[n] in response to electric potentials of the Q node Q and the QB node QB.

The node controller 132 includes a first transistor T1, a 1A-th transistor T1A, a third transistor T3, a 3A-th transistor T3A, a 3n-th transistor T3$n$, a 3nA-th transistor T3$n$A, a 3q-th transistor T3$q$, a fourth transistor T4, a 4l-th transistor T4$l$, a 4q-th transistor T4$q$, a fifth transistor T5, and a 5q-th transistor T5$q$.

A gate electrode and a first electrode of the first transistor T1 are commonly connected to a (N−2)-th carry signal line C[n−2], and a second electrode thereof is connected to a Qh node Qh. The first transistor T1 is turned on by the (N−2)-th carry signal applied through the (N−2)-th carry signal line C[n−2] and serves to transfer the (N−2)-th carry signal to the Qh node Qh.

A gate electrode of the 1A-th transistor T1A is connected to the (N−2)-th carry signal line C[n−2], a first electrode thereof is connected to the second electrode of the first transistor T1, and a second electrode thereof is connected to Q node Q. The 1A-th transistor T1A is turned on by the (N−2)-th carry signal applied through the (N−2)-th carry signal line C[n−2] and serves to charge the Q node Q on the basis of the (N−2)-th carry signal.

A gate electrode of the third transistor T3 is connected to the QB node QB, a first electrode thereof is connected to the Q node Q, and a second electrode thereof is connected to the first electrode of the 3A-th transistor T3A. The third transistor T3 is turned on in response to the electric potential of the QB node QB and serves to discharge the Q node Q to a third low voltage of a third low voltage line GVSS2 along with the 3A-th transistor T3A.

A gate electrode of the 3A-th transistor T3A is connected to the QB node QB, a first electrode thereof is connected to the second electrode of the third transistor T3, and a second electrode thereof is connected to the third low voltage line GVSS2. The 3A-th transistor T3A is turned on in response to the electric potential of the QB node QB and serves to discharge the Q node Q to the third low voltage of the third low voltage line GVSS2 along with the third transistor T3.

A gate electrode of the 3n-th transistor T3$n$ is connected to an (N+2)-th carry signal line C[n+2], a first electrode thereof is connected to the Q node Q, and a second electrode thereof is connected to a first electrode of the 3nA-th transistor TnA. The 3n-th transistor T3$n$ is turned on by an (N+2)-th carry signal applied through the (N+2)-th carry signal line C[n+2] and serves to discharge the Q node Q to the third low voltage of the third low voltage line GVSS2 along with the 3nA-th transistor T3$n$A.

A gate electrode of the 3nA-th transistor T3$n$A is connected to the (N+2)-th carry signal line C[n+2], a first electrode thereof is connected to the second electrode of the 3n-th transistor T3$n$, and a second electrode thereof is connected to the third low voltage line GVSS2. The 3nA-th transistor T3$n$A is turned on by the (N+2)-th carry signal applied through the (N+2)-th carry signal line C[n+2] and serves to discharge the Q node Q to the third low voltage of the third low voltage line GVSS2 along with the 3n-th transistor T3$n$.

A gate electrode of the 3q-th transistor T3$q$ is connected to Q node Q, a first electrode thereof is connected to a first high voltage line GVDD, and a second electrode thereof is connected to the Qh node Qh. The 3q-th transistor T3$q$ is turned on in response to the electric potential of the Q node Q and serves to transfer the first high voltage of the first high voltage line GVDD to the Qh node Qh.

A gate electrode of the fourth transistor T4 is connected to one terminal of a first capacitor Ca and a second electrode of the 4l-th transistor T4$l$, a first electrode thereof is connected to the first high voltage line GVDD, and a second electrode thereof is connected to the other terminal of the first capacitor Ca and the QB node QB. The fourth transistor T4 is turned on by the first high voltage transferred through the 4l-th transistor T4$l$ and serves to charge the QB node QB with the first high voltage of the first high voltage line GVDD. The first capacitor Ca serves to generate a bootstrapping voltage at the gate node of the fourth transistor T4.

A gate electrode and a first electrode of the 4l-th transistor T4$l$ are connected to the first high voltage line GVDD and a second electrode thereof is connected to the gate electrode of the fourth transistor T4 and the first electrode of the 4q-th transistor T4$q$. The 4l-th transistor T4$l$ is turned on by the first high voltage and serves to transfer the first high voltage of the first high voltage line GVDD to the gate node of the fourth transistor T4.

A gate electrode of the 4q-th transistor T4$q$ is connected to the Q node Q, a first electrode thereof is connected to the gate electrode of the fourth transistor T4 and the second electrode of the 4l-th transistor T4$l$, and a second electrode thereof is connected to a second low voltage line GVSS1. The 4q-th transistor T4$q$ is turned on in response to the electric potential of the Q node Q and serves to transfer the second low voltage of the second low voltage line GVSS1 to the gate node of the fourth transistor T4 (to discharge the gate node of T4).

A gate electrode of the fifth transistor T5 is connected to the (N−2)-th carry signal line C[n−2], a first electrode thereof is connected to the QB node QB, and a second electrode thereof is connected to the third low voltage line GVSS2. The fifth transistor T5 is turned on by the (N−1)-th carry signal of the (N−2)-th carry signal line C[n−2] and serves to discharge the QB node QB to the third low voltage of the third low voltage line GVSS2.

A gate electrode of the 5q-th transistor T5$l$ is connected to the Q node Q, a first electrode thereof is connected to the second electrode of the fourth transistor T4, one terminal of the first capacitor Ca and the QB node QB, and a second electrode thereof is connected to the third low voltage line GVSS2. The 5q-th transistor T5$q$ is turned on in response to the electric potential of the Q node Q and serves to discharge the QB node QB to the third low voltage of the third low voltage line GVSS2.

The reset circuit 133 includes at least one of a 5A-th transistor T5A and a 5B-th transistor T5B. The 5B-th transistor T5B may be omitted in the reset circuit 133.

A gate electrode of the 5A-th transistor T5A is connected to a reset signal line RST, a first electrode thereof is connected to the QB node QB, and a second electrode thereof is connected to a first electrode of the 5B-th transistor T5B. The 5A-th transistor T5A is turned on by a reset signal of the reset signal line RST and serves to reset the QB node QB to the third low voltage of the third low voltage line GVSS2 along with the 5B-th transistor T5B.

A gate electrode of the 5B-th transistor TSB is connected to a node M (node M can be normally selected as a node to which a carry signal is transferred although it depends on the design of the node controller), a first electrode thereof is connected to the second electrode of the 5A-th transistor TSA, and a second electrode thereof is connected to the third low voltage line GVSS2. The 5B-th transistor TSB is turned on in response to the electric potential of the node M and serves to reset the QB node QB to the third low voltage of the third low voltage line GVSS2 along with the 5A-th transistor TSA.

The output circuit 134 includes first buffer transistors T6A, T6A and T6C that output the first scan signal Scouta[b], second buffer transistors T6B and T7B that output the second scan signal Scoutb[n], and third buffer transistors T6cr and T7cr that output a carry signal C[n].

The first buffer transistors T6A and T7A include a first pull-up transistor T6A turned on in response to the electric potential of the Q node Q and a first pull-down transistor T7A turned on in response to the electric potential of the QB node QB. A gate electrode of the first pull-up transistor T6A is connected to the Q node Q, a first electrode thereof is connected to a first clock signal line SCCLKA[n], and a second electrode thereof is connected to a first output terminal SCOUTA[n]. A gate electrode of the first pull-down transistor T7A is connected to the QB node QB, a first electrode thereof is connected to the first output terminal SCOUTA[n], and a second electrode thereof is connected to the first low voltage line GVSS0. The first buffer transistors T6A and T7A output a first scan signal Scouta[n] on the basis of a first clock signal applied through the first clock signal line SCCLKA[n] and the first low voltage applied through the first low voltage line GVSS0.

The second buffer transistors T6B and T7B include a second pull-up transistor T6B turned on in response to the electric potential of the Q node Q and a second pull-down transistor T7B turned on in response to the electric potential of the QB node QB. A gate electrode of the second pull-up transistor T6B is connected to the Q node Q, a first electrode thereof is connected to a second clock signal line SCCLKB[n], and a second electrode thereof is connected to a second output terminal SCOUTB[n]. A gate electrode of the second pull-down transistor T7B is connected to the QB node QB, a first electrode thereof is connected to the second output terminal SCOUTB[n], and a second electrode thereof is connected to the first low voltage line GVSS0. The second buffer transistors T6B and T7B output the second scan signal Scoutb[n] on the basis of a second clock signal applied through the second clock signal line SCCLKB[n] and the first low voltage applied through the first low voltage line GVSS0.

The third buffer transistors T6cr and T7cr include a third pull-up transistor T6cr turned on in response to the electric potential of the Q node Q and a third pull-down transistor T7cr turned on in response to the electric potential of the QB node QB. A gate electrode of the third pull-up transistor T6cr is connected to the Q node Q and one terminal of a second capacitor Cb (boosting capacitor), a first electrode thereof is connected to a third clock signal line SRCLK[n], and a second electrode thereof is connected to a third output terminal C[n], the other terminal of the second capacitor Cb and one terminal of a third capacitor Cc. A gate electrode of the third pull-down transistor T7cr is connected to the QB node QB, a first electrode thereof is connected to the third output terminal C[n] and one terminal of the third capacitor Cc, and a second electrode thereof is connected to the third low voltage line GVSS2 and the other terminal of the third capacitor Cc. The third buffer transistors T6cr and T7cr output the carry signal C[n] on the basis of a third clock signal applied through the third clock signal line SRCLK[n] and the third low voltage applied through the third low voltage line GVSS2.

The second embodiment includes the first dummy buffer transistor T6C with one electrode floating in order to eliminate a parasitic capacitance (or TFT Cap) deviation between the first pull-up transistor T6A and the second pull-up transistor T6B when output buffers are designed such that their channel regions have different widths under the condition such as "first pull-up transistor T6A<second pull-up transistor T6B".

The first dummy buffer transistor T6C serves to compensate for a shortage of parasitic capacitance for the first pull-up transistor T6A. While a gate electrode of the first dummy buffer transistor T6C is connected to the Q node Q and a first electrode thereof is connected to the first clock signal line SCCLKA[n], the second electrode of the first dummy buffer transistor T6C remains in a floating state.

When the width of the channel region of the first pull-up transistor T6A is defined as "Buffer A", the width of the channel region of the second pull-up transistor T6B is defined as "Buffer B" and the width of the channel region of the first dummy buffer transistor T6C is defined as "Buffer C", a relationship among the widths of the channel regions can be represented as "Buffer A+C (compensation) Buffer B".

Therefore, the first dummy buffer transistor T6C is formed to have a common gate and common drain connection structure with the first pull-up transistor T6A and a source (source electrode) in a floating state in order to execute a function as a compensation transistor (form a compensation capacitor) as described above.

As shown in FIGS. 19 and 20, the shift register 131 according to the third embodiment includes a node controller 132, a reset circuit 133 and an output circuit 134. In comparison of the shift register 131 according to the third embodiment with the shift register 131 according to the second embodiment, the first dummy buffer transistor T6C has different configurations and the shift registers 131 according to the second and third embodiments are substantially the same. Accordingly, the part related to the first dummy buffer transistor T6C is described and the second embodiment is referred to for the remaining part.

The third embodiment includes a first dummy buffer transistor T6C that is diode-connected in order to eliminate a parasitic capacitance (or TFT Cap) deviation between the first pull-up transistor T6A and the second pull-up transistor T6B when output buffers are designed such that their channel regions have different widths under the condition such as "first pull-up transistor T6A<second pull-up transistor T6B".

The first dummy buffer transistor T6C serves to compensate for a shortage of parasitic capacitance for the first pull-up transistor T6A. A gate electrode of the first dummy buffer transistor T6C is connected to the Q node Q and first and second electrodes thereof are connected to the first clock signal line SCCLKA[n] such that the first dummy buffer transistor T6C is in a diode connection state.

When the width of the channel region of the first pull-up transistor T6A is defined as "Buffer A", the width of the channel region of the second pull-up transistor T6B is defined as "Buffer B" and the width of the channel region of the first dummy buffer transistor T6C is defined as "Buffer C", a relationship among the widths of the channel regions can be represented as "Buffer A+(Buffer C (compensation))×2≃Buffer B".

Therefore, the first dummy buffer transistor T6C is formed to be in a diode connection structure in which the first dummy buffer transistor T6C has a common gate and a common drain with the first pull-up transistor T6A and a source (source electrode) connected to the drain (drain electrode) in order to execute a function as a compensation transistor (form a compensation capacitor) as described above.

As described above, the disclosure can solve a problem of falling time deviation in output signals by position which can be caused when output buffers of a shift register are designed such that their channel regions have different widths. In addition, the disclosure can compensate for a parasitic capacitance deviation between clock signal lines of the shift register and thus can solve a node charging problem that can be caused by a parasitic capacitance deviation in output buffers. Furthermore, the disclosure can minimize the influence of a load between clock signal lines according to the compensation function of the dummy transistor added to the shift register. Moreover, the disclosure can execute a compensation design within a range in which a bezel area is not increased because compensation is performed in an output buffer stage of the shift register.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A shift register, comprising:
a node controller configured to control charging and discharging of a first node and a second node; and
an output circuit including a first buffer transistor configured to output a first scan signal, a second buffer transistor configured to output a second scan signal, and a third buffer transistor configured to output a carry signal in response to electric potentials of the first node and the second node,
wherein the first buffer transistor and the second buffer transistor have different channel region widths,
wherein the output circuit further includes a first dummy buffer transistor having a common gate and a common drain connection structure with the first buffer transistor, and
wherein the first dummy buffer transistor includes a source in a floating state.

2. A shift register, comprising:
a node controller configured to control charging and discharging of a first node and a second node; and
an output circuit including a first buffer transistor configured to output a first scan signal, a second buffer transistor configured to output a second scan signal, and a third buffer transistor configured to output a carry signal in response to electric potentials of the first node and the second node,
wherein the first buffer transistor and the second buffer transistor have different channel region widths,
wherein the output circuit further includes a first dummy buffer transistor having a common gate and a common drain connection structure with the first buffer transistor, and
wherein the first dummy buffer transistor includes a source and a drain that are electrically connected to each other.

3. A shift register, comprising:
a node controller configured to control charging and discharging of a first node and a second node; and
an output circuit including a first pull-up transistor configured to output a first scan signal, a second pull-up transistor configured to output a second scan signal and a third pull-up transistor configured to output a carry signal in response to electric potentials of the first node and the second node,
wherein the first pull-up transistor and the second pull-up transistor have different channel region widths, and the output circuit further includes a first dummy buffer transistor having a common gate and a common drain connection structure with the first pull-up transistor.

4. The shift register of claim 3, wherein the first dummy buffer transistor includes a source in a floating state.

5. The shift register of claim 3, wherein the first dummy buffer transistor includes a source and a drain that are electrically connected to each other.

6. The shift register of claim 3, wherein
the first pull-up transistor includes a channel region having a first width,
the second pull-up transistor includes a channel region having a second width,
the first dummy buffer transistor includes a channel region having a third width, and
the first, second, and third widths have a relationship of first width+third width≈second width.

7. The shift register of claim 3, wherein
the first pull-up transistor includes a channel region having a first width,
the second pull-up transistor includes a channel region having a second width,
the first dummy buffer transistor includes a channel region having a third width, and
the first, second, and third widths have a relationship of first width+(third width)×2≈second width.

8. The shift register of claim 3, wherein the first pull-up transistor has a gate electrode electrically connected to the first node, a first electrode electrically connected to a first clock signal line, and a second electrode electrically connected to a first output terminal configured to output the first scan signal,
the second pull-up transistor has a gate electrode electrically connected to the first node, a first electrode electrically connected to a second clock signal line, and a second electrode electrically connected to a second output terminal configured to output the second scan signal, and
the first dummy buffer transistor has a gate electrode electrically connected to the first node and a first electrode electrically connected to the first clock signal line.

9. A display device, comprising:
a display panel configured to display images;
a data driver configured to provide data voltages to the display panel; and
a scan driver including:
a level shifter configured to output a clock signal for supplying scan signals to the display panel; and
a shift register including:
a node controller configured to control charging and discharging of a first node and a second node; and
an output circuit including a first buffer transistor configured to output a first scan signal, a second buffer transistor configured to output a second scan signal, and a third buffer transistor configured to output a carry signal in response to electric potentials of the first node and the second node,
wherein the first buffer transistor and the second buffer transistor have different channel region widths,
wherein the output circuit further includes a first dummy buffer transistor having a common gate and a common drain connection structure with the first buffer transistor, and wherein the first dummy buffer transistor includes a source in a floating state.

10. A display device, comprising:
a display panel configured to display images;
a data driver configured to provide data voltages to the display panel; and
a scan driver including:
   a level shifter configured to output a clock signal for supplying scan signals to the display panel; and
   a shift register including:
      a node controller configured to control charging and discharging of a first node and a second node; and
      an output circuit including a first buffer transistor configured to output a first scan signal, a second buffer transistor configured to output a second scan signal, and a third buffer transistor configured to output a carry signal in response to electric potentials of the first node and the second node,
wherein the first buffer transistor and the second buffer transistor have different channel region widths,
wherein the output circuit further includes a first dummy buffer transistor having a common gate and a common drain connection structure with the first buffer transistor,
wherein the first dummy buffer transistor includes a source in a floating state; and
wherein the first dummy buffer transistor includes a source and a drain that are electrically connected to each other.

* * * * *